Dec. 9, 1969 W. E. MILLER, JR., ET AL 3,483,370

PUSH-PULL CORRELATING AMPLIFIER FOR USE WITH A PHOTODIODE

Filed July 11, 1967

Walter E. Miller, Jr.
Jimmy R. Duke,
INVENTORS.
BY Harry M. Saragovitz
Edward J. Kelly
Herbert Berl
Aubrey J. Dunn 3,483,370

PUSH-PULL CORRELATING AMPLIFIER FOR USE WITH A PHOTODIODE

Walter E. Miller, Jr., and Jimmy R. Duke, Huntsville, Ala., assignors to the United States of America as represented by the Secretary of the Army Filed July 11, 1967, Ser. No. 652,635
Int. Cl. H01j 39/12
U.S. Cl. 250—214 6 Claims

ABSTRACT OF THE DISCLOSURE

A correlating amplifier having a reverse biased photodiode connected to a resistive load and two amplifiers capacitively connected to the load to produce a correlatable push-pull output.

BACKGROUND OF THE INVENTION

The field of this invention is amplifiers. In particular this invention relates to operational amplifiers used in connection with a photodiode. There is a need for a correlating amplifier for use with a high frequency, wide band system such as a GaAs pulsed laser, utilizing a silicon photodiode as the detection element.

A conventional amplifier for a silicon photodiode detector has the output current of the detector passing through a load resistor and with the voltage across the resistor amplified by a high input impedance voltage amplifier.

SUMMARY OF THE INVENTION

In this invention the load resistor is removed from the circuit, the voltage amplifier is replaced by a current-to-voltage amplifier, and the signal is fed directly into the amplifier. This invention provides a circuit which can monitor a high-frequency, wide-band, pulsating light source and produce a voltage representative thereof. Problems of amplifier noise, battery noise, and electromagnetic radiation pickup are effectively dealt with.

A reversed biased photodiode is subjected to a wideband light source. The signal from the light source is fed to two amplifiers arranged in a push-pull configuration. The outputs of the two amplifiers may be summed or multiplied together to better the signal to noise ratio. The output signals' amplitudes add, being in phase, while noise amplitudes, being unrelated in the two amplifiers, add as the square root of the sum of the squares.

DESCRIPTION OF THE PREFERRED EMBODIMENT

Figure 1:
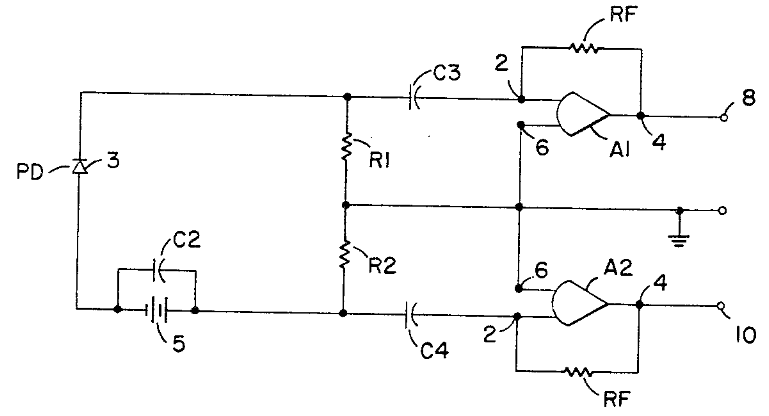
FIGURE 1 is a schematic diagram of an embodiment of the present invention.

Reference will be first made to an alternate embodiment of the invention which is shown in FIGURE 1. Capacitor C3 and resistor R1, as well as capacitor C4 and resistor R2, form high pass filters. Their parameters may be chosen to reject any frequencies below a certain level. This enables the circuit to be selective as to the pulsating frequencies of the light source that are to be recognized. Operational amplifiers A1 and A2 are current-to-voltage negative feedback amplifiers. The inputs to the amplifiers A1 and A2, pins 2, stay at virtual ground, providing a low load impedance to the photodiode.

Silicon photodiode 3 is reverse biased by battery 5. Capacitor C2 is selected to short circuit any noise originating in battery 5. Photodiode 3 has a high impedance and, as the light intensity increases thereon, the impedance decreases. Pins 2 of high-gain amplifiers A1 and A2 stay at virtual ground. As the impedance of the photodiode decreases, the voltage across the photodiode changes and the charge stored on capacitors C3 and C4 changes. The changing charge on capacitor C3 results in a positive current flow from capacitor C3 toward amplifier A1. The changing charge on capacitor C4 results in a negative current flow from capacitor C4 toward amplifier A2.

Operational amplifier A1 senses the current at pin 2. The operational amplifier operates in an effort to maintain pin 2 at virtual ground. A resulting current is conducted through feedback resistor RF and through the amplifier by way of pins 4 and 6 to ground. The amplifier is a high gain amplifier. Consequently, the voltage at output 8 of the circuit is greatly increased in proportion to the current at pin 2.

The operation of amplifier A2 and capacitor C4 is the same as the operation of amplifier A1 and capacitor C3, except the current is negative instead of positive with respect to pin 2. The output voltages at outputs 8 and 10 are equal, assuming the amplifiers; parameters are equal, but have opposite polarity.

An advantage of this arrangement is that as long as the ground connections of the two amplifiers remain at ground potential, the noise generated by them is unrelated, and correlation techniques may be used to improve the signal to noise ratio without reducing the signal into either amplifier over that available had only a single amplifier been used.

As an example of the improvement available through the use of this concept, assume that one of the outputs is inverted and added to the other. Signal amplitudes add, being in phase, but noise amplitudes, being unrelated in the two amplifiers, add as the square root of the sum of the squares. The signal to noise ratio is now $$(V1+V2)/(n1^2+n2^2)^{1/2}$$

wherein V1 and V2 are the output voltages and $n1$ and $n2$ are the output noise voltages. If both amplifiers have the same gain and the same noise level, the signals out (V1 and V2) are equal, and r.m.s. noise voltages $(n1^2)^{1/2}$ and $(n2^2)^{1/2}$ are equal. This results then in an improvement in signal to noise ratio by 1.4, and twice the signal amplitude obtainable with the conventional amplifier.

Figure 2:
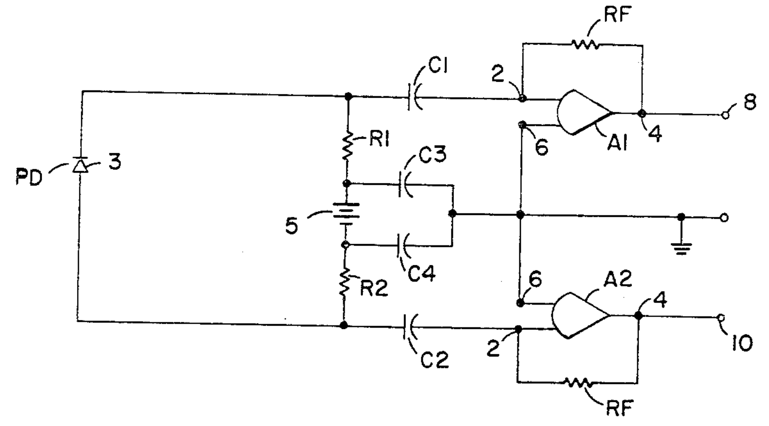
FIGURE 2 is a schematic diagram of the preferred embodiment of the present invention.

The preferred embodimet of the present invention is shown in FIGURE 2. This embodiment of the invention operates in a similar manner to the circuit of FIGURE 1. Its main difference lies in its reduced susceptibility to electromagnetic radiation pickup. Any pickup by the components of the circuit which are not grounded has a short circuit to ground through capacitors C3 and C4. Another advantage of this embodiment is that the bias battery 5 is isolated from the signal path. During standby, a time when no light is being detected, a steady-state condition exists for the entire circuit. The current supplied by the battery flows about the loop formed by resistor R1, photodiode 3, and resistor R2. A change in light intensity at the photodiode will result in a change in impedance thereof and thus a change in the circuit voltage as seen by capacitors C1 and C2. The resulting current causes a signal at the amplifiers. This signal is amplified as previously explained for FIGURE 1.

While the invention has been described with reference to two embodiments thereof, it will be apparent that various modifications and other embodiments thereof will occur to those skilled in the art within the scope of the invention. Accordingly, we desire the scope of our invention to be limited only by the appended claims.

We claim:

1. A correlating amplifier comprising: a photodiode; reverse bias means connected to said photodiode; a load in series with said photodiode; a plurality of capacitors connected to said load; and amplifying means connected to said capacitors, said amplifying means comprising a first and a second amplifier; a first of said capacitors being connected between one side of said load and an input of said first amplifier; a second of said capacitors being connected between the other side of said load and an input of said second amplifier; and leads connecting said load to a second input of each of said amplifiers.

2. A correlating amplifier as set forth in claim 1 wherein said first and second amplifiers are negative feedback amplifiers.

3. A correlating amplifier as set forth in claim 2 wherein said reverse bias means comprises a battery and a capacitor, said capacitor being connected across said battery.

4. A correlating amplifier comprising: a photodiode; reverse bias means connected to said photodiode; a load in series with said photodiode; a plurality of capacitors connected to said load; and amplifying means connected to said capacitors, said amplifying means comprising a first and a second amplifier each including a ground input; a first of said capacitors being connected between one side of said load and an input of said first amplifier; a second of said capacitors being connected between the other side of said load and an input of said second amplifier; a third and fourth of said capacitors being connected to said load; and means connecting said third and fourth capacitors to said ground inputs of said amplifiers.

5. A correlating amplifier as set forth in claim 4 wherein said load comprises first and second resistors and said reverse bias means comprises a battery; said battery being series connected between said first and second resistor; said third capacitor being connected to a first side of said battery and said fourth capacitor being connected to a second side of said battery.

6. A correlating amplifier as set forth in claim 5 wherein said first and second amplifiers are negative feedback amplifiers.

References Cited

UNITED STATES PATENTS 3,265,900 8/1966 Smith ---------------- 250—214

RALPH G. NILSON, Primary Examiner

T. N. GRIGSBY, Assistant Examiner

U.S. Cl. X.R.

250—210, 211